United States Patent
Choi et al.

(10) Patent No.: US 12,211,630 B2
(45) Date of Patent: Jan. 28, 2025

(54) STRETCHABLE ELECTRONICS AND METHOD FOR MANUFACTURING THE SAME

(71) Applicant: ELECTRONICS AND TELECOMMUNICATIONS RESEARCH INSTITUTE, Daejeon (KR)

(72) Inventors: Ji Hun Choi, Daejeon (KR); Chan Woo Park, Daejeon (KR); Ji-Young Oh, Daejeon (KR); Seung Youl Kang, Daejeon (KR); Yong Hae Kim, Daejeon (KR); Hee-ok Kim, Daejeon (KR); Jeho Na, Daejeon (KR); Jaehyun Moon, Daejeon (KR); Jong-Heon Yang, Daejeon (KR); Himchan Oh, Daejeon (KR); Seong-Mok Cho, Daejeon (KR); Sung Haeng Cho, Daejeon (KR); Jae-Eun Pi, Daejeon (KR); Chi-Sun Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 164 days.

(21) Appl. No.: 17/889,204

(22) Filed: Aug. 16, 2022

(65) Prior Publication Data
US 2023/0091070 A1    Mar. 23, 2023

(30) Foreign Application Priority Data

Sep. 17, 2021 (KR) .................. 10-2021-0124594
Jun. 24, 2022 (KR) .................. 10-2022-0077198

(51) Int. Cl.
*H01B 3/30*    (2006.01)
*H01B 7/06*    (2006.01)
(Continued)

(52) U.S. Cl.
CPC ............... *H01B 7/06* (2013.01); *H01B 3/306* (2013.01); *H01B 13/008* (2013.01); *H05K 7/06* (2013.01); *H01B 3/302* (2013.01); *H01B 3/46* (2013.01)

(58) Field of Classification Search
CPC ...... H01B 13/008; H01B 3/302; H01B 3/306; H01B 3/46; H01B 3/30; H01B 7/06;
(Continued)

(56) References Cited

U.S. PATENT DOCUMENTS 9,842,669 B2   12/2017  Park
10,986,727 B2   4/2021  Lim
(Continued)

FOREIGN PATENT DOCUMENTS

KR   10-2017-0069360 A   6/2017
KR   10-2021-0082061 A   7/2021
(Continued)

*Primary Examiner* — Timothy J Thompson
*Assistant Examiner* — Guillermo J Egoavil

(57) ABSTRACT

Provided are stretchable electronics and a method for manufacturing the same. The stretchable electronics may include a substrate, a plurality of electronic elements disposed to be spaced apart from each other on the substrate, and a wire structure disposed on the substrate to connect the plurality of electronic elements to each other. The wire structure may include an insulator extending from one of the electronic elements to the other of the adjacent electronic elements and a metal wire configured to cover a top surface and side surfaces of the insulator. The insulator may include at least one bent part in a plan view.

14 Claims, 11 Drawing Sheets

(51) Int. Cl.
  *H01B 13/008*    (2006.01)
  *H05K 7/06*    (2006.01)
  *H01B 3/46*    (2006.01)

(58) Field of Classification Search
  CPC ......... H05K 1/0283; H05K 2201/0133; H05K 2201/09263; H05K 3/107; H05K 7/06
  USPC ........................................................ 174/69
  See application file for complete search history.

(56)    References Cited

U.S. PATENT DOCUMENTS

| | | | | |
|---|---|---|---|---|
| 2006/0110580 | A1* | 5/2006 | Aylward | G02F 1/133305 428/172 |
| 2013/0041235 | A1* | 2/2013 | Rogers | H05K 1/0283 600/386 |
| 2014/0104793 | A1* | 4/2014 | Park | H01L 23/5387 438/667 |
| 2021/0134772 | A1 | 5/2021 | Jung | |
| 2021/0280827 | A1 | 9/2021 | Oh | |

FOREIGN PATENT DOCUMENTS

| | | | |
|---|---|---|---|
| KR | 20210082061 A * | 7/2021 | ........... G06F 1/1652 |
| KR | 10-2021-0112246 A | 9/2021 | |
| WO | WO-2020023012 A1 * | 1/2020 | |
| WO | 2020/073591 A1 | 4/2020 | |

* cited by examiner

STRETCHABLE ELECTRONICS AND METHOD FOR MANUFACTURING THE SAME

CROSS-REFERENCE TO RELATED APPLICATIONS

This U.S. non-provisional patent application claims priority under 35 U.S.C. § 119 of Korean Patent Application Nos. 10-2021-0124594, filed on Sep. 17, 2021, and 10-2022-0077198, filed on Jun. 24, 2022, the entire contents of which are hereby incorporated by reference.

BACKGROUND

The present disclosure herein relates to stretchable electronics, and more particularly, to a structure of a wire applied to stretchable electronics and a method of manufacturing the same.

The stretchable electronics are closely related to real life by being applied to wearable devices, health care devices, and the like, and thus, studies related to the stretchable electronics are steadily progressing.

As a method for implementing stretchable electronics, various methods such as a method of constructing a signal network using nanowires, a method of manufacturing a device in a state in which the substrate is pulled in advance to have a bent shape, and a method of applying a stretchable material to a material of electronics, and a method of connecting electronics to a stretchable wire are being studied. Among these, the most stable and mass-productible method is a method of connecting the electronics to the stretchable wire, and thus, studies on the stretchable wire is in progress to secure high stretchable performance of the stretchable electronics.

SUMMARY

The present disclosure provides stretchable electronics including a wire having improved electrical characteristics and a method for manufacturing the same.

The present disclosure also provides stretchable electronics including a wire having improved stretchable characteristics and a method for manufacturing the same.

The object of the present disclosure is not limited to the aforesaid, but other objects not described herein will be clearly understood by those skilled in the art from descriptions below.

An embodiment of the inventive concept provides stretchable electronics including: a substrate; a plurality of electronic elements disposed to be spaced apart from each other on the substrate; and a wire structure disposed on the substrate to connect the plurality of electronic elements to each other. The wire structure includes: an insulator extending from one of the electronic elements to the other of the adjacent electronic elements; and a metal wire configured to cover a top surface and side surfaces of the insulator. The insulator may include at least one bent part in a plan view.

In an embodiment, the substrate may include an elastomer.

In an embodiment, the insulator may include polyimide.

In an embodiment, the metal wire may cover the entire top surface and side surfaces of the insulator.

In an embodiment, the metal wire may expose a portion of the top surface of the insulator.

In an embodiment, the metal wire may include: a first metal wire provided on the top surface of the insulator; and second metal wires provided on the side surfaces of the insulator, respectively, wherein the first metal wire may be spaced apart from the second metal wires.

In an embodiment, the insulator may include a trench provided in the top surface of the insulator and extending along a direction in which the insulator extends, and the metal wire on the top surface of the insulator may conformally cover an inside wall and a bottom of the trench.

In an embodiment, the trench may be provided in plurality, and the trenches may be spaced apart from each other in a direction perpendicular to the extension direction in which the insulator extends.

In an embodiment, the insulator may include a trench provided in the top surface of the insulator and extending along a direction in which the insulator extends, an inside of the trench may be filled with a conductive pattern, and the metal wire on the top surface of the insulator may cover the top surface of the insulator and a top surface of the conductive pattern.

In an embodiment of the inventive concept, stretchable electronics includes: a substrate; a plurality of electronic elements disposed to be spaced apart from each other on the substrate; an insulator disposed on the substrate to connect two adjacent electronic elements of the plurality of electronic elements to each other; and a metal wire configured to cover side surfaces and a top surface of the insulator. The insulator includes at least one bent part in a plan view, and the metal wire electrically connects two adjacent electronic elements of the plurality of electronic elements to each other. The insulator includes a trench provided in the top surface of the insulator, wherein the trench extends in a direction in which the insulator extends.

In an embodiment, the trench may be provided in plurality, and the trenches may be spaced apart from each other in a direction perpendicular to the extension direction in which the insulator extends.

In an embodiment, an inside of the trench may be filled with a conductive pattern, and the metal wire on the top surface of the insulator may cover the top surface of the insulator and a top surface of the conductive pattern.

In an embodiment, the substrate may include an elastomer.

In an embodiment, the insulator may include polyimide.

In an embodiment of the inventive concept, a method for manufacturing stretchable electronics includes: providing an insulator on a top surface of a carrier substrate; patterning the insulator so that the insulator is bent in a plan view; depositing a metal wire on top and side surfaces of the insulator to form a wire structure; and embedding the wire structure in an insulating layer.

In an embodiment, the patterning of the insulator may be performed through one of an imprint method, an inkjet printing method, and a photolithography method.

In an embodiment, the method may further include: forming a sacrificial layer between the insulators of the carrier substrate; and forming an under-cut in the sacrificial layer.

In an embodiment, the embedding the wire structure in the insulating layer may further include: attaching a pick-up film on a top surface of the metal wire to separate the wire structure from the carrier substrate; embedding the separated wire structure in the insulating layer; and removing the pick-up film.

In an embodiment, the method may further include, after embedding the wire structure in the insulating layer, separating the wire structure from the carrier substrate.

In an embodiment, the metal wire may be deposited through one of atomic layer deposition (ALD), chemical vapor deposition (CVD), physical vapor deposition (PVD), or a solution process.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
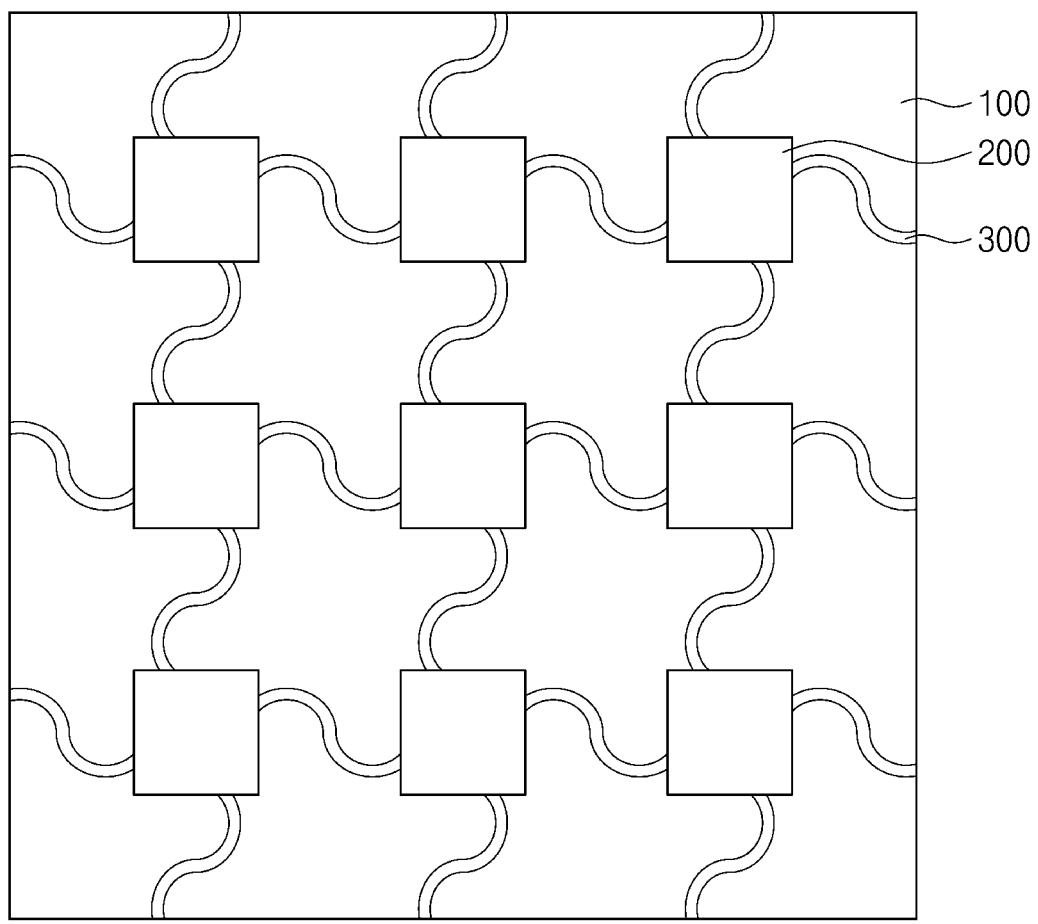
FIG. 1 is a plan view of stretchable electronics according to embodiments of the inventive concept.

Embodiments of the inventive concept will be described with reference to the accompanying drawings so as to sufficiently understand constitutions and effects of the inventive concept. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific exemplary embodiment while not limiting the present invention. In this specification, the terms of a singular form may comprise plural forms unless specifically mentioned. As used in this specification, the meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

In this specification, each of phrases such as "A or B", "at least one of A or B", "at least one of A or B", "A, B or C", at least one of "A, B and C", or at least one of "A, B, or C" may include any one of, or all possible combinations of, items listed together in the corresponding one of the phrases, or all possible combinations thereof.

Also, though terms like a first, a second, and a third are used to describe various regions and layers (or films) in various embodiments of the present invention, the regions and the layers are not limited to these terms. These terms are used only to discriminate one area or layer (or film) from another area or layer (or film). Therefore, a layer referred to as a first layer in one embodiment can be referred to as a second layer in another embodiment. An embodiment described and exemplified herein includes a complementary embodiment thereof. Throughout the specification, like reference numerals in the drawings denote like elements.

Unless terms used in embodiments of the present invention are differently defined, the terms may be construed as meanings that are commonly known to a person skilled in the art.

Hereinafter, stretchable electronics and a method for manufacturing the same according to the inventive concept will be described with reference to the drawings.

Stretchable electronics may be expanded or contracted in at least one direction by external force. For example, the stretchable electronics may be expanded or contracted in a longitudinal direction. However, in some embodiments, the stretchable electronics may be expanded or contracted in all directions. A shape of the stretchable electronics may be freely deformed. The stretchable electronics may refer to an output device capable of outputting visual information even if the shape is deformed. Thus, the stretchable electronics may be disposed on an uneven surface. The stretchable electronics may be deformed in shape according to a surface on which the stretchable electronics is disposed. The stretchable electronics may be reversibly stretched. For example, when external force is applied to the stretchable electronics, the stretchable electronics may be stretched, and when the external force is removed, the stretchable electronics may return to its original shape. Thus, the stretchable electronics may be repeatedly stretched. The stretchable electronics may be used for an output device. The stretchable electronics may be used as a wearable communication device, a body-embedded or attachable bio device, and the like. The application of the stretchable electronics is not limited thereto.

FIG. 1 is a plan view of stretchable electronics according to embodiments of the inventive concept. Although FIG. 1 schematically illustrates a shape of a wire structure for convenience, the shape according to embodiments of the inventive concept is not limited to that illustrated in FIG. 1.

Referring to FIG. 1, stretchable electronics may include a substrate 100, an electronic element 200, and wire structures 300. The substrate 100 may include a flexible substrate. For example, the substrate 100 may be made of an elastomer. The substrate 100 may be made of polydimethylsiloxane (PDMS) or polyurethane (PU). However, in embodiment of the inventive concept, the material of the substrate 100 is not limited thereto, and the substrate 100 may be made of various materials that are used as a flexible substrate. The substrate 100 may be an elastomer having a lower Young's modulus than that of an insulator to be described later. Young's modulus is an elastic modulus that defines the relationship between force per unit applied to an elastic material and a strain rate. Thus, the substrate 100 may be more easily deformed than the insulator during the stretching.

The substrate 100 may be expanded or contracted by external force. Here, the substrate 100 may be expanded or contracted in one direction or both directions, or differently, the substrate 100 may be expanded or contracted in all directions. The substrate 100 may be deformed in shape according to the extension or contraction of the stretchable electronics. The substrate 100 may be provided to support or protect various components of the stretchable electronics.

A plurality of electronic elements 200 may be disposed on the substrate 100. The plurality of electronic elements 200 may be arranged to be spaced apart from each other on the substrate 100. The plurality of electronic elements 200 may be arranged in a first direction and a second direction, which are parallel to a top surface of the substrate 100 and cross each other. For example, as illustrated in FIG. 1, the plurality of electronic elements 200 may be arranged in the form of a lattice along the first direction and the second direction. However, an embodiment of the inventive concept is not limited thereto, and the plurality of electronic elements 200 may be arranged in various shapes as necessary. The plurality of electronic elements 200 may include a plurality of insulating layers and a plurality of conductive layers. Each of the plurality of electronic elements 200 may include a thin film transistor. A light emitting element electrically connected to the thin film transistor may be further provided on each of the plurality of electronic elements 200. The light emitting element may be an organic light emitting diode (OLED) or a micro light emitting diode (micro-LED).

The wire structures 300 may be disposed on the substrate 100. The wire structures 300 may be connected to the plurality of electronic elements 200, respectively. For example, a pair of adjacent electronic elements 200 may be connected to both ends of one wire structure 300, respectively. The electronic elements 200 arranged in the first direction and the second direction may be connected by the wire structures 300. The wire structures 300 may electrically connect the plurality of electronic elements 200 to each other.

The shapes and numbers of the substrate 100, the plurality of electronic elements 200, and the wire structures 300 illustrated in FIG. 1 may be provided as examples, and thus, the shapes and numbers of the substrate 100, the plurality of electronic elements 200 and the wire structure may be variously changed as necessary.

Hereinafter, the shapes of the wire structures 300 will be described based on one wire structure 300. The wire structure 300 may extend from one electronic element 200 to another adjacent electronic element 200. The wire structure 300 may be expanded or contracted in at least one direction. For example, the wire structure 300 may be expanded or contracted between the one electronic element 200 and the other electronic element 200, and thus, an interval between the one electronic element 200 and the other electronic element 200 may be increased or decreased. When the wire structure 300 is expanded in a direction that is away from the one electronic element 200 and the other electronic element 200, the wire structure 300 may be deformed in a straight line shape. The wire structure 300 may have a structure that relieves stress applied to the wire structure 300 when the wire structure 300 is contracted or expanded by external force. This will be described in detail later. The wire structure 300 may include one insulator and one or more metal wires. Hereinafter, the structure of the wire structure 300 will be described in detail.

Figure 2:
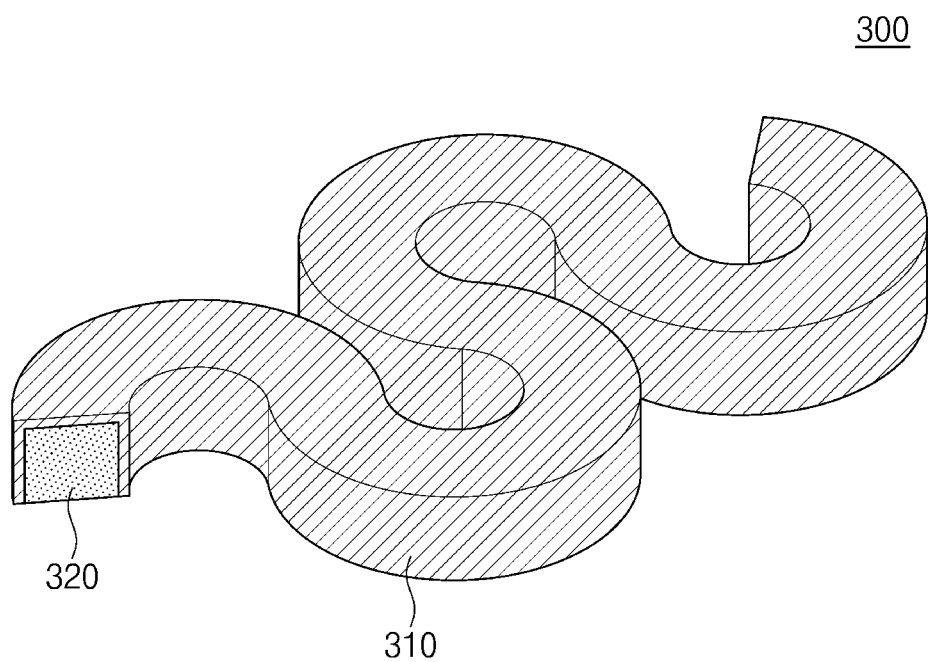
FIG. 2 is a perspective view of the stretchable electronics according to embodiments of the inventive concept.
Figure 3:
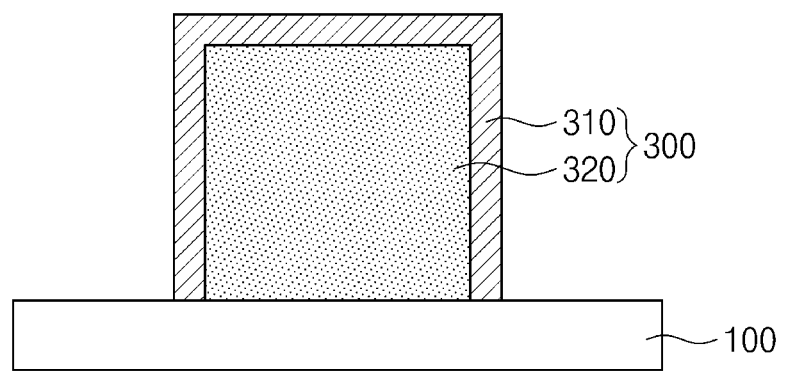
FIG. 3 is a cross-sectional view of the stretchable electronics according to embodiments of the inventive concept.

FIG. 2 is a perspective view of the stretchable electronics according to embodiments of the inventive concept. FIG. 3 is a cross-sectional view of the stretchable electronics according to embodiments of the inventive concept and corresponds to a vertical cross-section of the wire structure of the stretchable electronics of FIG. 2.

Referring to FIGS. 2 and 3, the wire structure 300 may be provided on the substrate 100. The wire structure 300 may include an insulator 320. A bottom surface of the insulator 320 may be in contact with the top surface of the substrate 100. The insulator 320 may include a top surface opposite to the bottom surface. The insulator 320 may include side surfaces that face each other. The insulator 320 may be provided to support the metal wire 310. The insulator 320 may extend from one electronic element 200 to another adjacent electronic element 200.

The insulator 320 may include at least one bent part in a plan view. In an embodiment, the bent part may be provided in plurality. However, the shape of the insulator 320 is not limited to the shape illustrated in FIG. 2, and the insulator 320 may include various shapes having bent parts. For example, the insulator 320 may have a serpentine shape, a zigzag shape, a spiral shape, and a spring shape. The cross-sectional shape of the insulator 320 may be a rectangular shape. As illustrated in FIG. 3, the insulator 320 has the rectangular cross-sectional shape, but an embodiment of the inventive concept is not limited thereto.

The insulator 320 may be made of an insulating material. The insulator 320 may be made of a flexible material. The insulator 320 may be a patternable material. For example, the insulator 320 may be a polymer material. The insulator 320 may be made of polyimide. However, the material of the insulator 320 is not limited thereto.

The metal wire 310 may be provided on the top surface and side surfaces of the insulator 320. The metal wire 310 may cover the entirety of the top surface and the side surfaces of the insulator 320. For example, a portion of the metal wire 310 disposed on the top surface of the insulator 320 and other portions of the metal wire 310 disposed on the side surfaces of the insulator 320 may be connected to each other. The metal wire 310 may extend from one of the side surfaces of the insulator 320 through the top surface of the insulator 320 to the other one of the side surfaces of the insulator 320. The insulator 320 may be embedded by the metal wire 310 on the substrate 100, and the top surface and the side surfaces of the insulator 320 may not be exposed by the metal wire 310. The shape of the metal wire 310 may be defined according to the shape of the insulator 320. For example, since the insulator 320 includes the bent portion in the plan view, the metal wire 310 may also include a bent portion in the plan view. In addition, the metal wire 310 may extend along the direction in which the insulator 320 extends. The metal wire 310 may be a wire for electrically connecting the plurality of electronic elements 200 (see FIG. 1) to each other. The metal wire 310 may include a conductive material. The metal wire 310 may include copper (Cu) or aluminum (Al), but an embodiment of the inventive concept is not limited thereto, and metals capable of conducting electricity may be provided.

Figure 4:
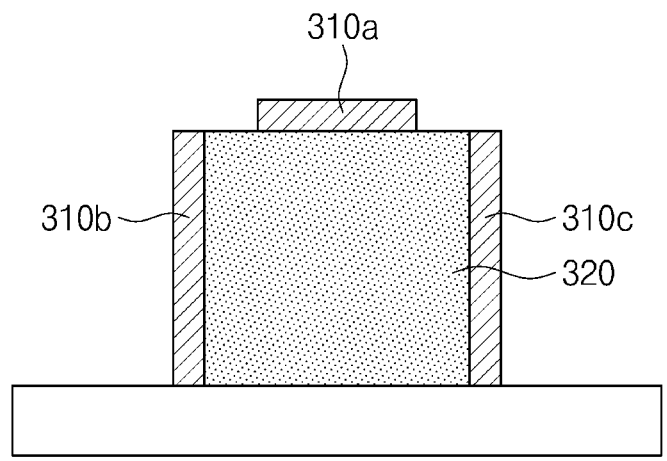
FIG. 4 is a cross-sectional view of stretchable electronics according to embodiments of the inventive concept.

FIG. 3 illustrates that the insulator 320 is embedded by the metal wire 310, but an embodiment of the inventive concept is not limited thereto. FIG. 4 is a cross-sectional view of stretchable electronics according to embodiments of the inventive concept. In the following embodiments, the components described in the embodiments of FIGS. 1 and 2 use the same reference numerals, and descriptions thereof are omitted or briefly described for convenience of description.

That is, differences between the embodiments of FIGS. 1 and 2 and the following embodiments will be mainly described.

Referring to FIG. 4, a metal wire 310 may expose a portion of an insulator 320. For example, the portion exposed by the metal wire 310 may be a portion of a top surface of the insulator 320. In more detail, as illustrated in FIG. 4, the metal wire 310 may include a first metal wire 310a, a second metal wire 310b, and a third metal wire 310c. The first metal wire 310a may be provided on the top surface of the insulator 320. The second metal wire 310b and the third metal wire 310c may be provided on side surfaces of the insulator 320, respectively. The second metal wire 310b and the third metal wire 310c may be disposed on the side surfaces that face each other. A width of the first metal wire 310a may be less than that of the insulator 320. In this case, the first metal wire 310a may be spaced apart from the side surfaces of the insulator 320. Thus, the first metal wire 310a may be spaced apart from the second metal wire 310b and the third metal wire 310c. The first metal wire 310a, the second metal wire 310b, and the third metal wire 310c may extend along a direction in which the insulator 320 extends. As illustrated in FIG. 4, the three metal wires 310a, 310b, and 310c may be provided in one insulator 320, but an embodiment of the inventive concept is not limited thereto. For example, four or more metal wires may be provided.

The electronic elements 200 (see FIG. 1) are electrically connected to each other by the metal wires 310a, 310b, and 310c spaced apart from each other, and thus, the metal wires 310a, 310b, and 310c may provide a plurality of electrical paths on one insulator. In general, a plurality of signal wires is required to drive a display. According to embodiments of the inventive concept, the metal wires 310a, 310b, and 310c providing the plurality of electrical paths may be applied to a signal wire for driving the display. In addition, according to embodiments of the inventive concept, the metal wires 310a, 310b, and 310c providing individual electrical paths to the top surface and side surfaces of one insulator may be provided, and thus, a width of the insulator may be relatively small when compared to a case in which one metal wire is provided on one insulator. Thus, stretch characteristics of the wire structure may be improved. In addition, to provide the plurality of electrical paths, when compared to a case in which a metal wire having a thin width is provided in plurality on a top surface of an insulator having a limited width, when metal wires, each of which has a wide width, are provided on top and side surfaces of an insulator, the metal wire may be improved in stability. Thus, driving stability of the wire structure may be improved.

Figure 5:
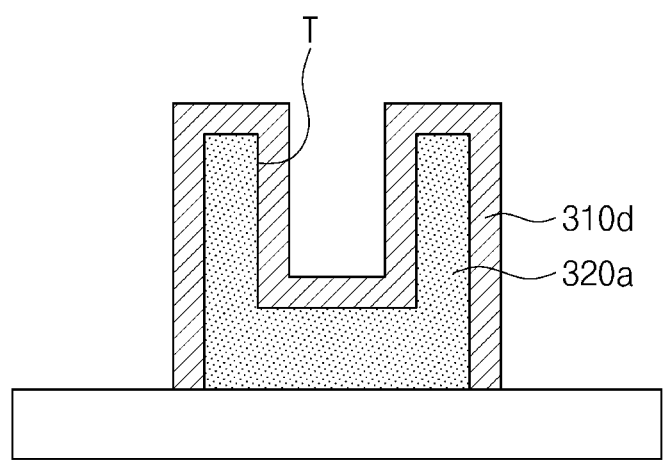
FIG. 5 is a cross-sectional view of stretchable electronics according to embodiments of the inventive concept.

FIG. 5 is a cross-sectional view of stretchable electronics according to embodiments of the inventive concept.

Referring to FIG. 5, a trench T may be provided on a top surface of an insulator 320a. The trench T of the insulator 320a may extend along a direction in which the insulator 320a extends. A metal wire 310d covering an inside wall and a bottom of the trench T may be provided on a top surface of the insulator 320a. The metal wire 310d may extend from one side surface of the insulator 320a to the other side surface of the insulator 320a through the top surface of the insulator 320a and the inside wall and bottom of the trench T. The metal wire 310d may cover an entire surface of the insulator 320a except for the bottom surface of the insulator 320a. The insulator 320a may not be exposed by the metal wire 310d.

Figure 6:
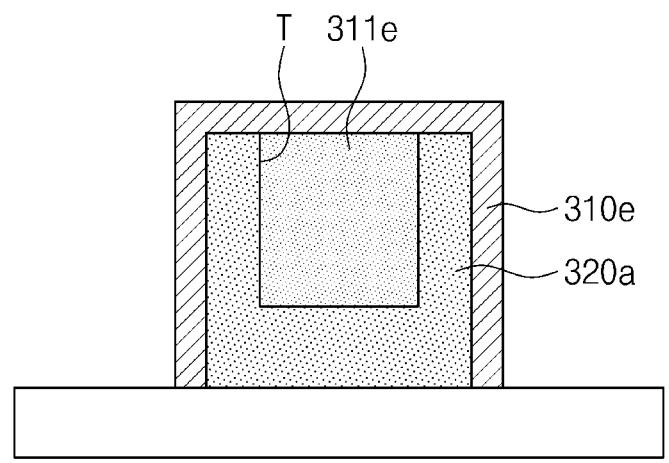
FIG. 6 is a cross-sectional view of stretchable electronics according to embodiments of the inventive concept.

FIG. 6 is a cross-sectional view of stretchable electronics according to embodiments of the inventive concept.

In FIG. 6, an insulator 320a including the trench T described with reference to FIG. 5 may be provided. A conductive pattern 311e may be provided in the trench T of the insulator 320a. The trench T may be filled with a conductive pattern 311e. The conductive pattern 311e may be a wire including a metal. A bottom surface of the conductive pattern 311e may be in contact with a bottom of the trench T. Side surfaces of the conductive pattern 311e may be in contact with inside wall of the trench T. A level of the top surface of the conductive pattern 311e may be the same as a level of the top surface of the insulator 320a. That is, the top surface of the conductive pattern 311e and the top surface of the insulator 320a may be coplanar.

The metal wire 310e may be provided on the insulator 320a. The metal wire 310e may cover the top surface and side surfaces of the insulator 320a and the top surface of the conductive pattern 311e. The metal wire 310e and the conductive pattern 311e may be in contact on the top surface of the insulator 320a. The metal wire 310e may extend from one side surface of the insulator 320a to the other side surface of the insulator 320a through the top surface of the insulator 320a and the top surface of the conductive pattern 311e. The metal wire 310e may cover the top surface and side surfaces of the insulator 320a and the entire top surface of the conductive pattern 311e. The insulator 320a and the conductive pattern 311e may not be exposed by the metal wire 310e. Since the conductive pattern 311e corresponding to an additional wire is provided in the trench T of the insulator 320a, the wire structure may be reduced in resistance.

Figure 7:
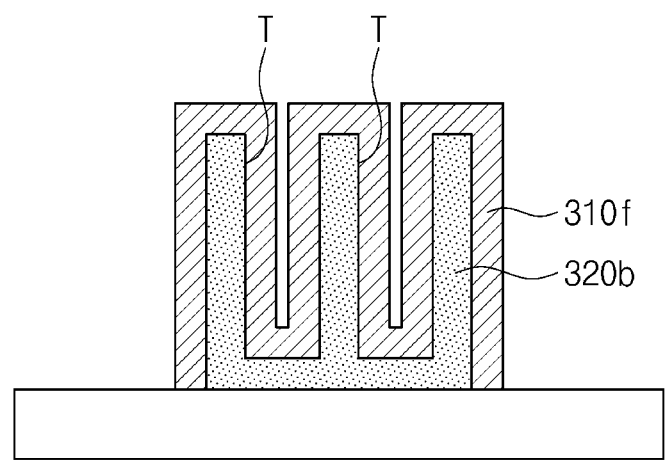
FIG. 7 is a cross-sectional view of stretchable electronics according to embodiments of the inventive concept.

FIG. 7 is a cross-sectional view of stretchable electronics according to embodiments of the inventive concept.

Referring to FIG. 7, a plurality of trenches T may be provided in an insulator 320b. The plurality of trenches T may extend along a direction in which the insulator 320b extends. The plurality of trenches T may be spaced apart from each other in a direction perpendicular to the direction in which the insulator 320b extends.

A metal wire 310f may conformally cover top and side surfaces of the insulator 320b and bottom and inside walls of the plurality of trenches T. The metal wire 310f may cover the entire surface except for the bottom surface of the insulator 320b. The insulator 320b may not be exposed by the metal wire 310f. As illustrated in FIG. 7, a structure in which two trenches of the plurality of trenches T are provided in the insulator 320b is illustrated, but an embodiment of the inventive concept is not limited thereto. For example, three or more trenches T may be provided.

Figure 8:
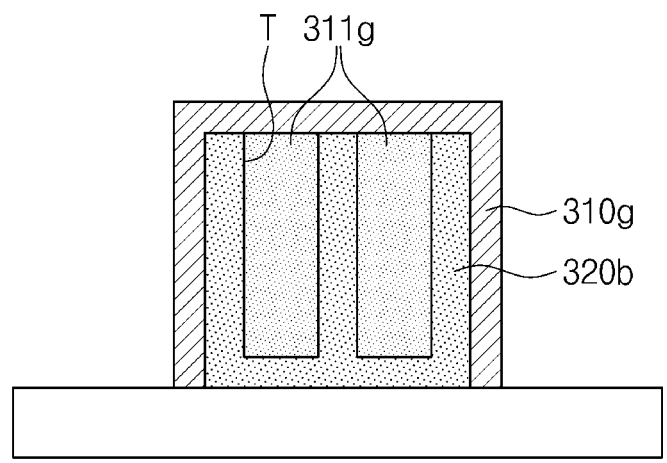
FIG. 8 is a cross-sectional view of stretchable electronics according to embodiments of the inventive concept.

FIG. 8 is a cross-sectional view of stretchable electronics according to embodiments of the inventive concept.

In FIG. 8, an insulator 320b including a plurality of trenches T described with reference to FIG. 7 may be provided. Conductive patterns 311g may be provided in the plurality of trenches T of the insulator 320b, respectively. A level of a top surface of each of the conductive patterns 311g may be the same as a level of a top surface of the insulator 320b. That is, the top surface of each of the conductive patterns 311g and the top surface of the insulator 320b may be coplanar.

The metal wire 310g may be provided on the insulator 320b. The metal wire 310g may cover the top surface and side surfaces of the insulator 320b and the top surface of the conductive patterns 311g. The metal wire 310g and the conductive patterns 311g may be in contact on the top surface of the insulator 320b. The metal wire 310g may extend from one side surface of the insulator 320b to the other side surface of the insulator 320b through the top surface of the insulator 320b and the top surface of the conductive patterns 311g. The metal wire 310g may cover the top surface and side surfaces of the insulator 320b and the entire top surface of the conductive patterns 311g. The insulator 320b and the conductive patterns 311g may not be exposed by the metal wire 310g. The conductive patterns 311g corresponding to the additional wires may be disposed in the trenches T of the insulator 320b to reduce resistance of a wire structure. As illustrated in FIG. 8, a structure in which two trenches of the plurality of trenches T are provided in the insulator 320b is illustrated, but an embodiment of the inventive concept is not limited thereto. For example, three or more trenches T may be provided. Thus, three or more conductive patterns 311g may be provided.

In the stretchable electronics according to the embodiments illustrated in FIGS. 2 to 8, the metal wire having a line width greater than that of the insulator may be applied to the wire structure. The metal wire applied to the existing stretchable electronics may be provided only on the top surface of the insulator, and a maximum width of the metal wire may be the width of the insulator. However, according to embodiments of the inventive concept, the metal wire may be provided not only on the top surface of the insulator, but also on the side surface of the insulator or inside the trench of the insulator, the metal wire having the line width greater than that of the insulator may be designed. Thus, since the line width of the metal wire increases compared to the width occupied by the wire structure, the resistance of the metal wire may be reduced. In addition, the width of the wire structure may be narrowed compared to the line width of the metal wire to relieve the stress applied to the wire structure when the stretchable electronics are expanded and contracted. Thus, stretch characteristics of the stretchable electronics may be improved. In the insulator in which the trench structure is provided according to the embodiments of the inventive concept illustrated in FIGS. 5 and 7, the line width of the metal wire may increase as the number of trenches increases, and as a depth of the trench increases in a direction perpendicular to the substrate, the line width of the metal wire may increase. As the line width of the metal wire increases, the resistance of the metal wire may decrease.

FIGS. 9 to 14 are cross-sectional views illustrating a method of manufacturing stretchable electronics according to embodiments of the inventive concept.

Figure 9:
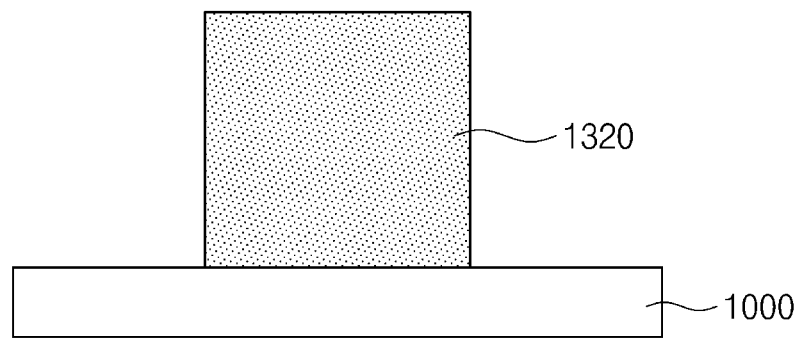
FIGS. 9 to 14 are cross-sectional views illustrating a method for manufacturing stretchable electronics according to embodiments of the inventive concept.

Referring to FIG. 9, an insulator 1320 may be provided on a top surface of a carrier substrate 1000. The insulator 1320 may be the same material as the insulator described with reference to FIG. 2. The carrier substrate 1000 may be a glass substrate.

The insulator 1320 may be patterned on the carrier substrate 1000. The insulator 1320 may be patterned to include at least one bent part in a plan view. The patterning method may be one of a lithography method through reactive ion etching (ME), a lithography method using an insulator made of a photosensitive material, an inkjet printing method, and an imprint method. As illustrated in FIG. 9, the insulator 1320 may be patterned to have a rectangular cross-sectional shape, but an embodiment of the inventive concept is not limited thereto. For example, the cross-sectional shape of the insulator 1320 may be patterned to include at least one trench. The trench may be patterned to extend along a direction in which the insulator 1320 extends. When a plurality of trenches is patterned on a top surface of the insulator 1320, the plurality of trenches may be patterned to be spaced apart from each other in a direction perpendicular to the direction in which the insulator 1320 extends.

In this case, the stretchable electronics described with reference to FIGS. 5 and 7 may be manufactured.

Figure 10:
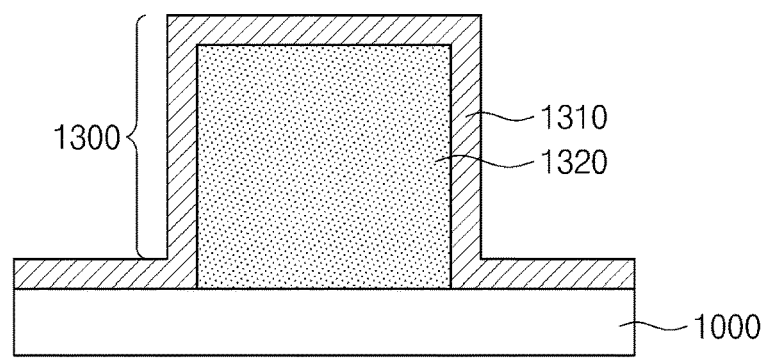

Referring to FIG. 10, a wire structure 1300 may be formed by depositing a metal wire 1310 on a top surface and side surfaces of the insulator 1320. The metal wire 1310 may cover a top surface of the carrier substrate 1000 on which the insulator 1320 is not provided and the entire top and side surfaces of the insulator 1320. The carrier substrate 1000 and the insulator 1320 may not be exposed by the deposited metal wire 1310. However, an embodiment of the inventive concept is not limited thereto, and a portion of the metal wire 1310 on the top surface of the insulator 1320 may be removed through an etching process. Thus, the metal wires 1310 deposited on the top surface of the insulator 1320 may be spaced apart from the metal wires 1310 deposited on the side surfaces of the insulator 1320. In this case, the stretchable electronics described with reference to FIG. 4 may be manufactured. Hereinafter, the description will be continued based on the embodiment of FIG. 10. The metal wire 1310 may be deposited to conformally cover the insulator 1320. Thus, the shape of the metal wire 1310 may be defined according to the shape of the insulator 1320. A method of depositing the metal wire 1310 may be one of atomic layer deposition (ALD), chemical vapor deposition (CVD), physical vapor deposition (PVD), or a solution process.

Figure 11:
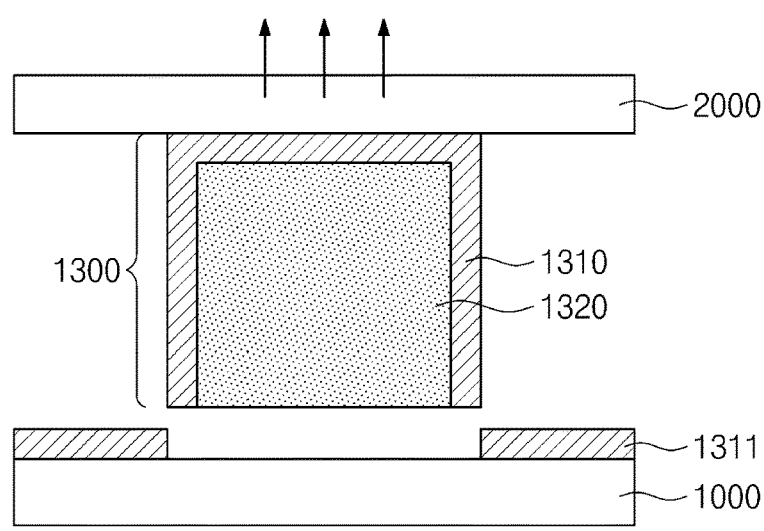

Referring to FIG. 11, a process of separating the wire structure 1300 from the carrier substrate 1000 using a pick-up film 2000 may be performed. The pick-up film 2000 may be attached to a top surface of the wire structure 1300. The pick-up film 2000 may be a film having adhesive properties. The pick-up film 2000 may be lift in a direction D1 perpendicular to the carrier substrate 1000 to separate the wire structure 1300 from the carrier substrate 1000. The pick-up film 2000 may separate the insulator 1320 and the metal wire 1310 provided on the top surface and side surfaces of the insulator 1320 from the carrier substrate 1000. After the process of separating the wire structure 1300 from the carrier substrate 1000, the metal wire 1311 may remain on a top surface of the carrier substrate 1000.

Figure 12:
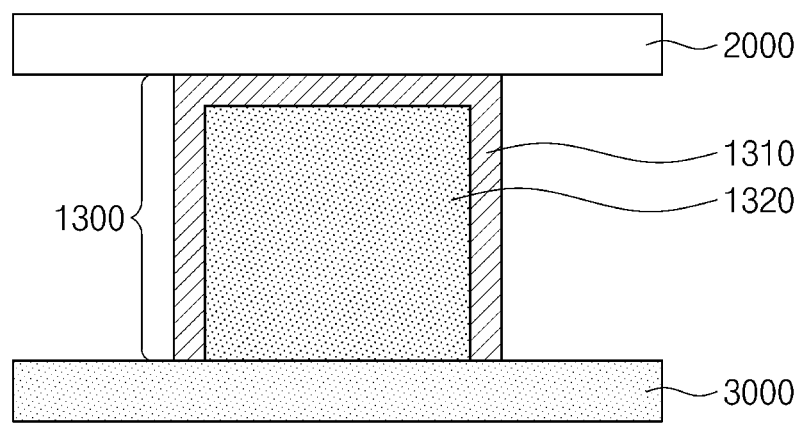

Referring to FIG. 12, a process of disposing the wire structure 1300 on the insulating layer 3000 may be performed. The metal wire 1310 provided on the side surfaces of the insulator 1320 and the bottom surface of the insulator 1320 may be in contact with the top surface of the insulating layer 3000. After the wire structure 1300 is disposed on the insulating layer 3000, the pick-up film 2000 may be removed from the wire structure 1300. In this case, the stretchable electronics described with reference to FIG. 3 may be manufactured. The insulating layer 3000 may be the substrate 100 (see FIG. 3) of the stretchable electronics. Hereinafter, the description will be continued based on the embodiment of FIG. 12. The insulating layer 3000 may be an elastomer. The insulating layer 3000 may be made of polydimethylsiloxane (PDMS) or polyurethane (PU). However, an embodiment of the inventive concept is not limited thereto.

Figure 13:
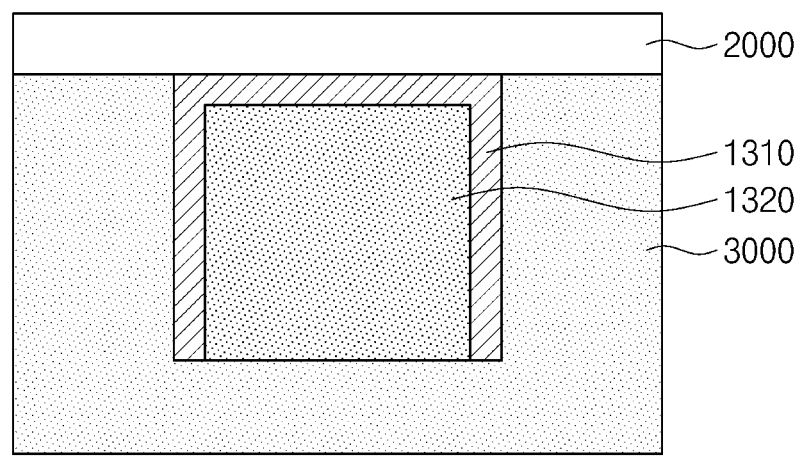

Referring to FIG. 13, a process of embedding the wire structure 1300 (see FIG. 11) in the insulating layer 3000 may be performed. The insulating layer 3000 may include the same material as the insulating layer 3000 described with reference to FIG. 12. The insulating layer 3000 may cover the metal wire 1310 provided on the side surfaces of the insulator 1320 and the bottom surface of the insulator 1320.

Figure 14:
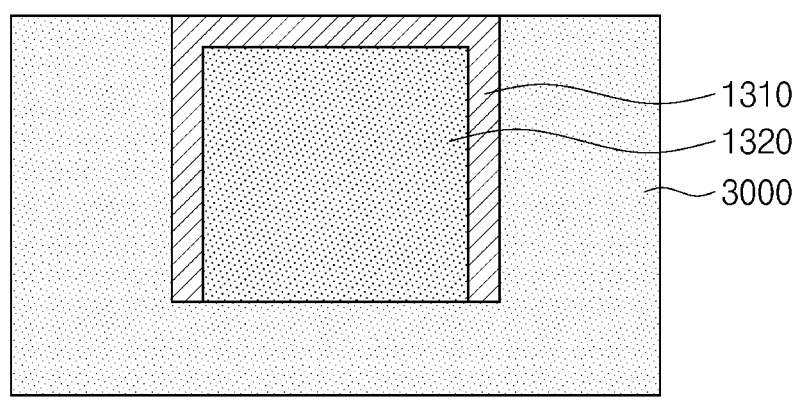

Referring to FIG. 14, after the wire structure 1300 is embedded in the insulating layer 3000, the pick-up film 2000 may be removed from the top surface of the insulating layer 3000 and the metal wire 1310. As the pick-up film 2000 is removed, the top surface of the metal wire 1310 may be exposed.

Figure 15:
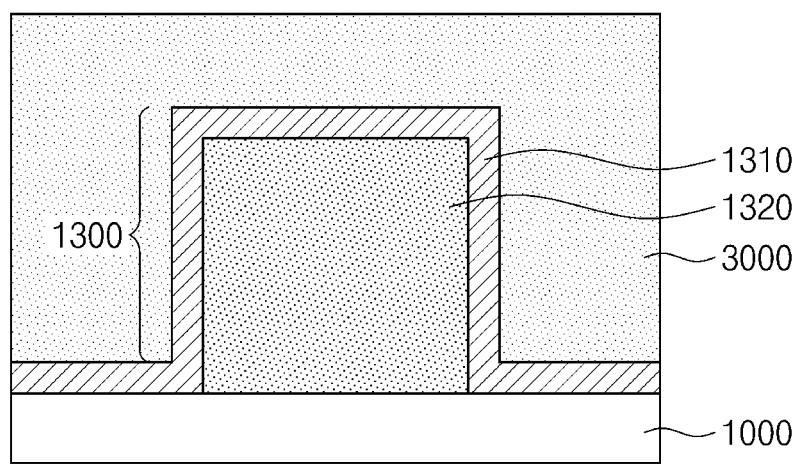
FIGS. 15 and 16 are cross-sectional views illustrating a method for manufacturing stretchable electronics according to embodiments of the inventive concept.
Figure 16:
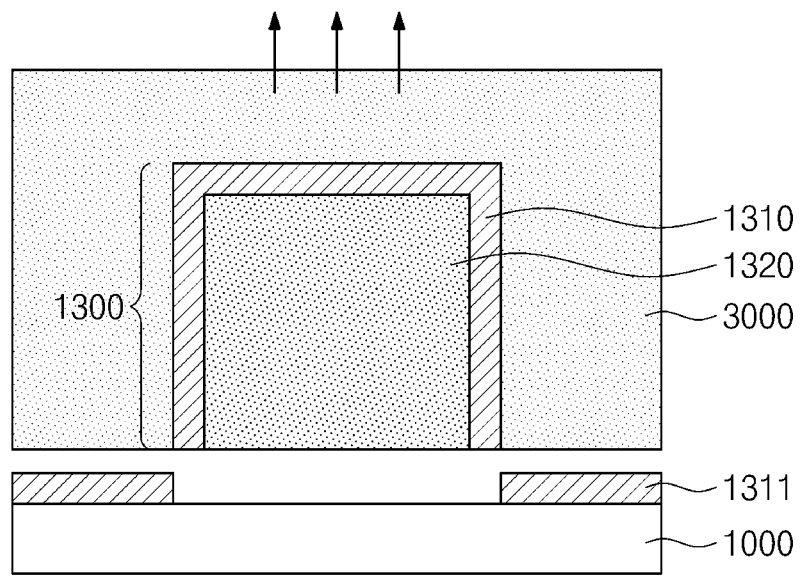

FIGS. 15 and 16 are cross-sectional views illustrating a method for manufacturing stretchable electronics according to embodiments of the inventive concept.

Referring to FIG. 15, a process of embedding a wire structure 1300 in an insulating layer 3000 may be performed on the results of FIGS. 9 and 10. The insulating layer 3000 may include the same material as the insulating layer 3000 described with reference to FIG. 12. The insulating layer 3000 may cover the top surface of the metal wire 1310 deposited on the top surface of the carrier substrate 1000 and the metal wire 1310 deposited on the top surface and side surfaces of the insulator 1320. The metal wire 1310 may not be exposed by the insulating layer 3000.

Referring to FIG. 16, the wire structure 1300 embedded in the insulating layer 3000 may be lifted in a direction D1 perpendicular to the carrier substrate 1000 so as to be separated from the carrier substrate 1000. As the wire structure 1300 is separated from the carrier substrate 1000, the bottom surface of the insulator 1320 may be exposed. After the wire structure 1300 is separated, the metal wire 1311 may remain on the top surface of the carrier substrate 1000.

FIGS. 17 to 20 are cross-sectional views illustrating a method for manufacturing stretchable electronics according to embodiments of the inventive concept.

Figure 17:
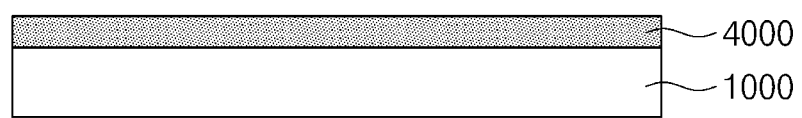
FIGS. 17 to 20 are cross-sectional views of stretchable electronics according to embodiments of the inventive concept.

Referring to FIG. 17, the process of forming a sacrificial layer 4000 on the carrier substrate 1000 may be further performed. The sacrificial layer 4000 may cover the entire top surface of the carrier substrate 1000. The sacrificial layer 4000 may include a material etched in the same etching method as the insulator 1320 (see FIG. 18) formed in a process to be described later. Alternatively, the sacrificial layer 4000 may include an insulator 1320 (see FIG. 18) and a material having etch selectivity.

Figure 18:
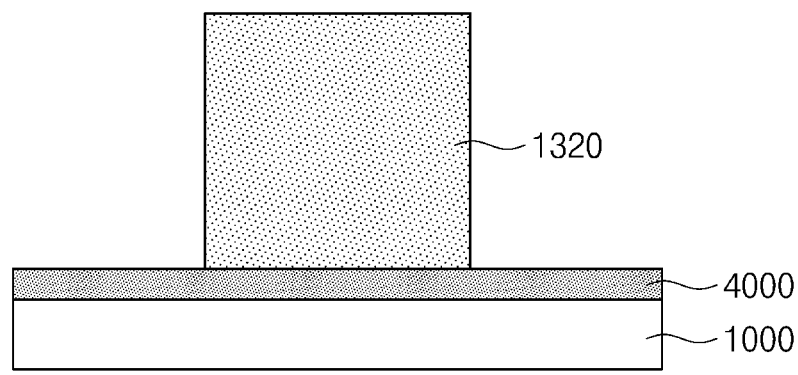

Referring to FIG. 18, the insulator 1320 may be formed on a top surface of the sacrificial layer 4000. A process of patterning the insulator 1320 may be the same as or similar to the process described with reference to FIG. 9. When the insulator 1320 is patterned, the sacrificial layer 4000 may also be patterned. For example, the patterned insulator 1320 may be used as a mask pattern. Thus, a portion of the sacrificial layer 4000 disposed under the patterned insulator 1320 may remain.

Figure 19:
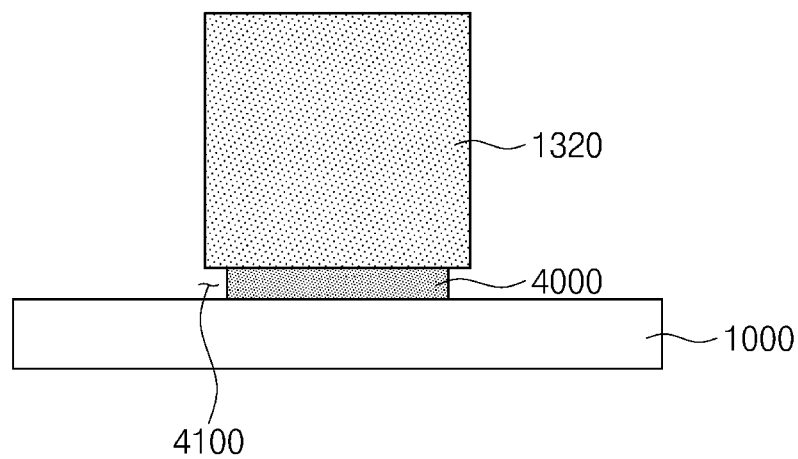

Referring to FIG. 19, in the patterning process, an under-cut of the sacrificial layer 4000 may be formed between the bottom surface of the insulator 1320 and the top surface of the carrier substrate 1000. For example, when the sacrificial layer 4000 is patterned, the sacrificial layer 4000 may be over-etched between the carrier substrate 1000 and the insulator 1320. As the under-cut 4100 of the sacrificial layer 4000 is formed, a width of the sacrificial layer 4000 may be less than that of the insulator 1320.

Figure 20:
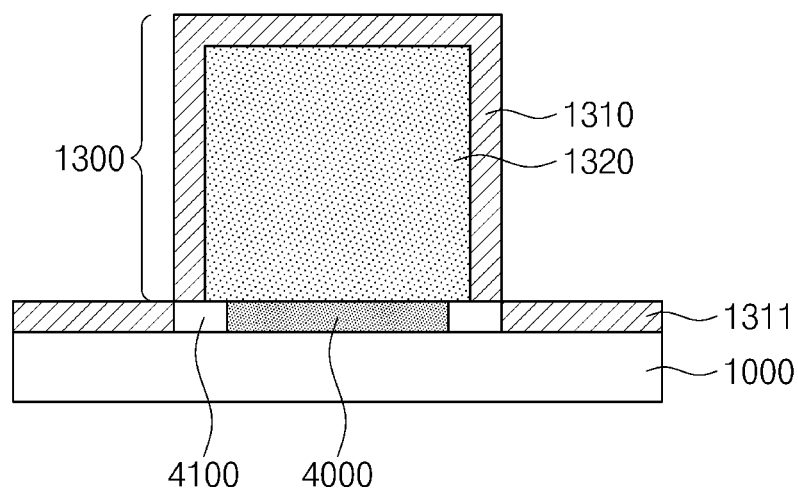

Referring to FIG. 20, after the sacrificial layer 4000 is patterned, the metal wire 1310 may be deposited on the insulator 1320 and the carrier substrate 1000. The metal wire 1310 may be deposited using the same or similar method to the deposition method described with reference to FIG. 10. As illustrated in FIG. 20, as the under-cut 4100 of the sacrificial layer 4000 is present, a contact width between the metal wire 1310 deposited on the side surfaces of the insulator 1320 and the metal wire deposited on the top surface of the carrier substrate 1000 may be less than a thickness of each of the metal wires 1310 and 1311. However, an embodiment of the inventive concept is not limited thereto, and the metal wire 1310 deposited on the side surfaces of the insulator 1320 may not be in contact with the metal wire 1311 deposited on the carrier substrate 1000.

After the metal wire 1310 is deposited, a process that is the same as or similar to the manufacturing method described with reference to FIGS. 11 to 16 may be performed to separate the wire structure 1300 from the carrier substrate 1000. In the process of separating the wire structure 1300 from the carrier substrate 1000, the insulator 1320 and the sacrificial layer 4000 may be separated from each other, and the sacrificial layer 4000 may remain on the carrier substrate 1000.

The sacrificial layer 4000 may be made of a material that is easily detachable from the insulator 1320. Since the sacrificial layer 4000 may be disposed between the carrier substrate 1000 and the insulator 1320, the metal wire 1310 deposited on the side surfaces of the insulator 1320 and the metal wire 1311 deposited on the top surface of the carrier substrate 1000 may be easily separated from each other. The separation of the wire structure 1300 from the carrier substrate 1000 may be facilitated. Therefore, the manufacturing of the stretchable electronics may be facilitated.

In the stretchable electronics according to the embodiments of the inventive concept, the metal wire may be provided not only on the top surface but also on the side surfaces of the insulator. That is, the metal wire having the line width greater than the width of the wire structure may be provided, and thus the resistance of the metal wire may be reduced. In addition, the width of the wire structure may be narrowed compared to the line width of the metal wire to relieve the stress applied to the wire structure when the stretchable electronics are expanded and contracted. That is, the stretchable electronics having the improved stretch characteristics may be provided.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Therefore, the above-disclosed embodiments are to be considered illustrative and not restrictive.

What is claimed is:

1. Stretchable electronics comprising:
a substrate;
a plurality of electronic elements disposed to be spaced apart from each other on the substrate; and
a wire structure disposed on the substrate to connect the plurality of electronic elements to each other,
wherein the wire structure comprises:
an insulator disposed on the substrate and extending from one of two adjacent electronic elements to the other of the two adjacent electronic elements; and
a metal wire configured to cover a top surface and side surfaces of the insulator and extend along a direction in which the insulator extends,
wherein the insulator comprises at least one bent part in a plan view,
wherein the insulator comprises a trench that is formed in an upper portion of the insulator to extend along the direction in which the insulator extends, and
wherein the metal wire is disposed along a profile of the trench to substantially conformally cover an inside wall and a bottom of the trench and to cover an entire surface of the insulator except for a bottom surface of the insulator.

2. The stretchable electronics of claim 1, wherein the substrate comprises an elastomer.

3. The stretchable electronics of claim 1, wherein the insulator comprises polyimide.

4. The stretchable electronics of claim 1, wherein the metal wire covers the entire top surface and side surfaces of the insulator.

5. The stretchable electronics of claim 1, wherein the trench is provided in plurality, and
the trenches are spaced apart from each other in a direction perpendicular to the extension direction in which the insulator extends.

6. Stretchable electronics comprising:
a substrate;
a plurality of electronic elements disposed to be spaced apart from each other on the substrate;
an insulator disposed on the substrate to connect two adjacent electronic elements of the plurality of electronic elements to each other; and
a metal wire configured to cover side surfaces and a top surface of the insulator,
wherein the insulator comprises at least one bent part in a plan view,
the metal wire electrically connects the two adjacent electronic elements of the plurality of electronic elements to each other and extends along a direction in which the insulator extends, and
the insulator comprises a trench formed in an upper portion of the insulator,
wherein the trench extends in the direction in which the insulator extends,
wherein an inside of the trench is filled with a conductive pattern, and
the metal wire on the top surface of the insulator covers the top surface of the insulator and a top surface of the conductive pattern.

7. The stretchable electronics of claim 6, wherein the trench is provided in plurality, and
the trenches are spaced apart from each other in a direction perpendicular to the extension direction in which the insulator extends.

8. The stretchable electronics of claim 6, wherein the substrate comprises an elastomer.

9. The stretchable electronics of claim 6, wherein the insulator comprises polyimide.

10. A method for manufacturing stretchable electronics, the method comprising:
providing an insulator on a top surface of a carrier substrate;
patterning the insulator so that the insulator is bent in a plan view;
depositing a metal wire on top and side surfaces of the insulator to form a wire structure;
embedding the wire structure in an insulating layer; and
separating the wire structure from the carrier substrate after embedding the wire structure in the insulating layer.

11. The method of claim 10, wherein the patterning of the insulator is performed through one of an imprint method, an inkjet printing method, and a photolithography method.

12. The method of claim 10, further comprising:
forming a sacrificial layer between the insulators of the carrier substrate; and
forming an under-cut in the sacrificial layer.

13. The method of claim 10, wherein the embedding the wire structure in the insulating layer further comprises:
attaching a pick-up film on a top surface of the metal wire to separate the wire structure from the carrier substrate;
embedding the separated wire structure in the insulating layer; and
removing the pick-up film.

14. The method of claim 10, wherein the metal wire is deposited through one of atomic layer deposition (ALD), chemical vapor deposition (CVD), physical vapor deposition (PVD), or a solution process.

\* \* \* \* \*